(12) United States Patent
Yanagisawa

(10) Patent No.: US 7,583,870 B2
(45) Date of Patent: Sep. 1, 2009

(54) METHOD FOR FABRICATING WIRING BOARD AND AN APPARATUS FOR FABRICATING WIRING BOARD

(75) Inventor: Kenji Yanagisawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/797,841

(22) Filed: May 8, 2007

(65) Prior Publication Data

US 2007/0266546 A1 Nov. 22, 2007

(30) Foreign Application Priority Data

May 16, 2006 (JP) .......................... P.2006-136737

(51) Int. Cl.
*G02B 6/12* (2006.01)
*G02B 6/26* (2006.01)
*H05K 13/04* (2006.01)

(52) U.S. Cl. .............................. 385/14; 385/52; 33/645; 29/831

(58) Field of Classification Search ....................... None
See application file for complete search history.

(56) References Cited

U.S. PATENT DOCUMENTS

2002/0168147 A1* 11/2002 Case et al. .................... 385/53

FOREIGN PATENT DOCUMENTS

JP 2000-214351 8/2000

* cited by examiner

*Primary Examiner*—Michelle R Connelly Cushwa
(74) *Attorney, Agent, or Firm*—Drinker Biddle & Reath LLP

(57) ABSTRACT

There is provided a method for fabricating a wiring board including: a mounting step of mounting a light transmitting member, the mounting step including: an arranging step of holding the light transmitting member by light transmitting holder to arrange the light transmitting member at a wiring board main body, and a step of curing a photo-curing resin material between the light transmitting member and the wiring board main body by light transmitted through the light transmitting member and the holder.

9 Claims, 6 Drawing Sheets

METHOD FOR FABRICATING WIRING BOARD AND AN APPARATUS FOR FABRICATING WIRING BOARD

BACKGROUND OF THE INVENTION

The present invention relates to a method for fabricating a wiring board constituted by being mounted with a light transmitting member and an apparatus for carrying out the method.

In recent years, in accordance with high speed formation of an electronic apparatus or a semiconductor apparatus, as a method substituting for electric wiring of a background art, a method of propagating a signal using a light waveguide path has been investigated. For example, a light waveguide path is constituted by a material constituting a core of the light waveguide path referred to as so-to-speak core member for transmitting signal light and a so-to-speak clad member formed to cover a surrounding of the core member. The clad member differs from the core member in a reflectance of signal light, and therefore, there is constituted a structure in which the signal light directed to the clad member from the core member is substantially reflected totally to a side of the core member by the clad member.

Further, various methods of mounting the light waveguide path to a wiring board are proposed. For example, the light waveguide path is formed by a resin material or the like and is difficult to be directly bonded to the wiring board, and therefore, a method of mounting the light waveguide path to the wiring board by using an adhering agent (adhering layer) is proposed.

[Patent Reference 1] JP-A-2000-214351

However, when, for example, the light waveguide path is mounted thereto by using a thermosetting resin (adhering agent), there is a case of posing a problem in a mounting accuracy.

For example, in mounting by thermosetting, there is a case of adopting a method of curing a thermosetting resin between a light waveguide path and a wiring board by heating both of the light waveguide path to be mounted and a side of the wiring board. In this case, there is a case of deteriorating a mounting accuracy by expansion of material by heat.

For example, in recent years, in order to reduce cost of fabricating a light waveguide path, an example of fabricating the light waveguide path by a resin material (for example, polymer species material) is increased. According to such a resin material, an influence of expansion or deformation by heating is considerable, and there poses a problem that it is difficult to use the thermosetting material.

SUMMARY OF THE INVENTION

Further, it is a general problem of the invention to provide a method for fabricating a wiring board and an apparatus for fabricating a wiring board which are novel and useful and resolve the above-described problem.

A specific problem of the invention resides in providing a method for fabricating a wiring board mounted with a light transmitting member with an excellent accuracy, and an apparatus for fabricating a wiring board mounted with a light transmitting member with an excellent accuracy.

In order to solve the problem, according to a first aspect of the invention, there is provided a method for fabricating a wiring board including:

a mounting step of mounting a light transmitting member, the mounting step including:

an arranging step of holding the light transmitting member by light transmitting holder and arranging the light transmitting member at a wiring board main body; and a step of curing a photo-curing resin material between the light transmitting member and the wiring board main body by light transmitted through the light transmitting member and the holder.

According to the invention, the wiring board mounted with the light transmitting member can be fabricated with excellent accuracy.

Further, at the arranging step, when positioning of the light transmitting member relative to the wiring board main body is carried out by recognizing an image of a reference point of the board main body transmitted through the holder, a mounting accuracy of the mounted member can further be improved.

Further, when the light transmitting member is held by the holder by vacuum adsorption, the light transmitting member is facilitated to be arranged.

Further, when the light transmitting member includes a light waveguide path, a board mixedly mounted with light and electricity can be fabricated with excellent accuracy.

Further, according to a second aspect of the invention, in order to solve the above-described problem, there is provided an apparatus for fabricating a wiring board by mounting a light transmitting member thereon, including:

a light transmitting holder for holding the light transmitting member to arrange the light transmitting member at a wiring board main body; and a light irradiator for curing a photo-curing resin material between the light transmitting member and the wiring board main body by irradiating light transmitting through the holder and the light transmitting member.

According to the invention, the wiring board mounted with the light transmitting member can be fabricated with excellent accuracy.

Further, when the fabricating apparatus further includes a recognizer for recognizing an image of a reference point of the wiring board main body transmitted through the holder for positioning the light transmitting member relative to the wiring board main body, the mounting accuracy of the mounted member can further be improved.

Further, when the holder is constituted to hold the light transmitting member by vacuum adsorption, the light transmitting member is facilitated to be arranged.

Further, when the light transmitting member includes a light waveguide path, a board mixedly mounted with light and electricity can be fabricated with excellent accuracy.

According to the invention, the method for fabricating the wiring board mounted with the light transmitting member with excellent accuracy and the apparatus for fabricating the wiring board mounted with the light transmitting member with excellent accuracy can be provided.

DETAILED DESCRIPTION OF THE PREFERRED EMBODIMENTS

A method for fabricating a wiring board according to the invention includes: a mounting step of mounting a light transmitting member, for example, a light waveguide path. In the mounting step, the light transmitting member is held by light transmitting holder and arranged at a wiring board main body, further, a photo-curing resin material between the member and the wiring board main body is cured by light transmitted through the member and the holder.

In the above-described fabricating method, adhering by thermosetting is not used, and therefore, the light transmitting member (light waveguide path) can be mounted with excellent accuracy. Further, in the fabricating method, the photo-curing resin between the member and the wiring board main body can be cured in a state of being held by the light transmitting holder.

Further, in the fabricating method, the holder is light transmitting, and therefore, there is achieved an effect of facilitating to recognize a reference point of positioning of the wiring board main body even when the reference point is covered by the holder. For example, the reference point is used as a reference point of positioning for arranging the member to the wiring board main body. Further, similarly, also the member held by the holder (a reference point of positioning the member) is facilitated to recognize.

Next, an explanation will be given of a constitution of the method and the apparatus for fabricating a wiring board capable of embodying the fabricating method in reference to the drawings.

Embodiment 1

Figure 1:
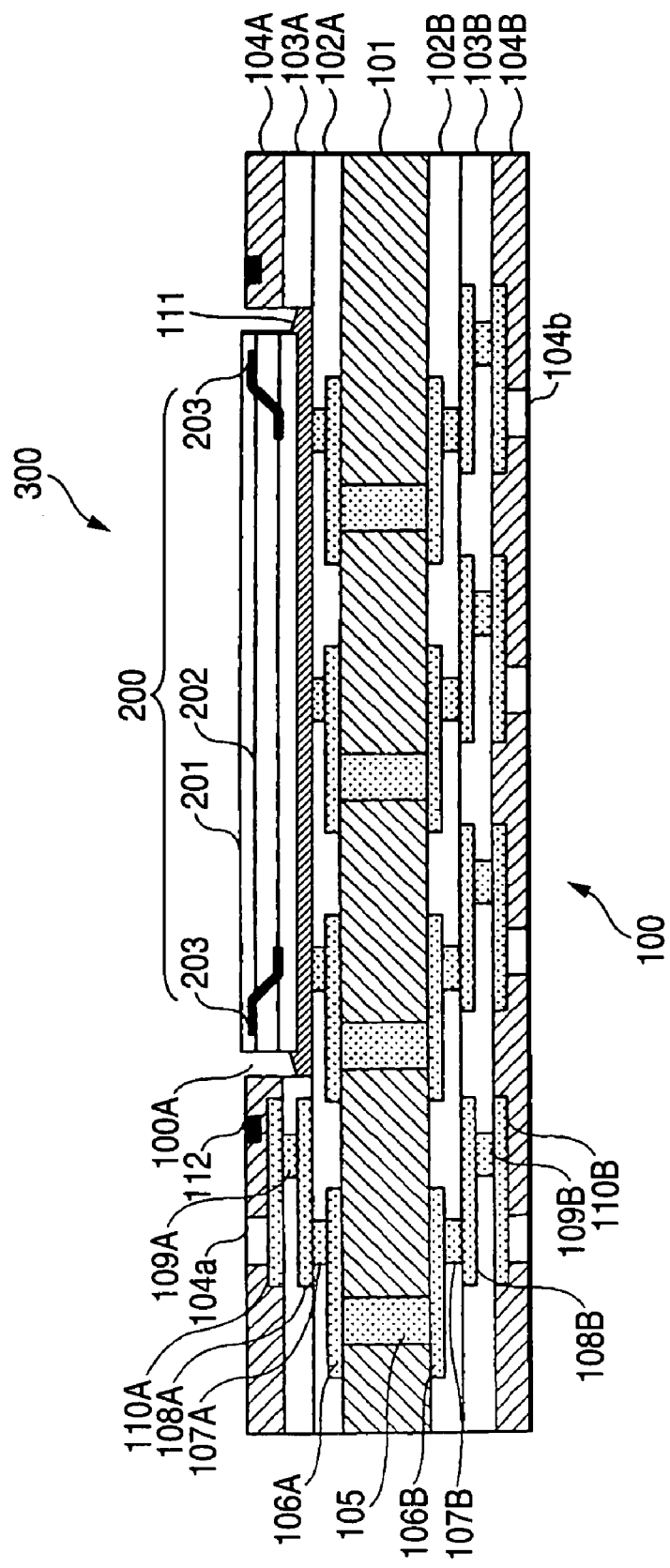
FIG. 1 shows an example of constituting a wiring board fabricated by a method for fabricating a wiring board according to embodiment 1.

FIG. 1 is a sectional view schematically showing an example of a constitution of a wiring board 300 fabricated by a method for fabricating a wiring board (apparatus for fabricating a wiring board) according to embodiment 1. In reference to FIG. 1, an outline of the wiring board 300 is provided with a structure of mounting a light transmitting member (light waveguide path) 200 to a wiring board main body 100.

First, when the wiring board main body 100 is viewed, the wiring board main body 100 is provided with a multilayer wiring structure including a core board 101 and constituted by respectively laminating insulating layers and wirings to both faces of the core board 101. The core board 101 is formed with a via plug 105 penetrating the core board 101.

A face on an upper side of the core board 101 is formed with a pattern wiring 106A connected to the via plug 105, and insulating layers 102A, 103A, 104A (solder resist layer) are laminated successively on the pattern wiring 106A.

Further, a via plug 107A connected to the pattern wiring 106A, a pattern wiring 108A connected to the via plug 107A, and a via plug 109A connected to the pattern wiring 108A are formed from the insulating layer 102A over to the insulating layer 103A to constitute the multilayer wiring structure. Further, a surface of a pattern wiring 110A formed on the insulating layer 103A and connected to the via plug 109A is covered by the insulating layer (solder resist layer) 104A. Further, a portion of the pattern wiring 110A is exposed from an opening portion 104a to be constituted to be able to be electrically connected to a pattern wiring.

Further, similarly, a face on a lower side of the core board 101 is formed with a pattern wiring 106B connected to the via plug 105, and insulating layers 102B, 103B, 104B (solder resist layer) are successively laminated to cover the pattern wiring 106B.

Further, a via plug 107B connected to the pattern wiring 106B, a pattern wiring 108B connected to the via plug 107B, and a via plug 109B connected to the pattern wiring 108B are formed from the insulating layer 102B over to the insulating layer 103B to constitute the multilayer wiring structure. Further, a surface of a pattern wiring 110B formed on the insulating layer 103B and connected to the via plug 109B is covered by the insulating layer (solder resist layer) 104B. Further, a portion of the pattern wiring 110B is exposed from an opening portion 104b formed at the insulating layer 104B to be constituted to be able to be electrically connected to a pattern wiring.

Further, the insulating layer 104A is formed with a marker 112 for constituting a reference point of the wiring board for positioning when the light transmitting member 200 is installed.

The wiring board main body 100 can be formed by a publicly-known build-up method. For example, the core board 101 is constituted by a prepreg member, the insulating layers 102A, 102B, 103A, 103B are constituted by a build-up resin (epoxy resin or polyimide resin or the like), further, the insulating layers 104A, 104B are constituted by a solder resist material, the via plugs 105, 107A, 107B, 109A, 109B, the pattern wirings 106A, 106B, 108A, 108B, 110A, 110B are constituted by Cu, respectively, however, the materials are only examples, and the wiring board main body 100 is not limited thereto.

In the above-described structure, the wiring board main body 100 is formed with a recess portion 100A for mounting the light transmitting member (light waveguide path) 200. That is, a portion in correspondence with the recess portion 100A is not formed with the insulating layers 103A, 104A. Further, the light transmitting member 200 is mounted to the recess portion 100A by a resin material 111. The resin material 200 is constituted by curing, for example, a photo-curing resin material. That is, according to the wiring board 300 by the embodiment, the light transmitting member 200 is brought into a state of being. bonded to the recess portion 100A of the wiring board main body 100 by the photo-curing resin material.

On the other hand, the light transmitting member 200 is constituted by, for example, a light waveguide path and is constituted such that a surrounding of a core 202 for transmitting signal light is covered by a clad 201. The clad 201 differs from the core 202 in a reflectance of signal light, and therefore, there is constituted a structure in which signal light directed to the clad 201 from the core 202 is substantially reflected totally to a side of the core 202.

Further, vicinities of both ends of the light transmitting member 200 are respectively embedded with mirrors 203 for reflecting signal light. Further, the mirror 203 can also be used as a point of reference of the light transmitting member for positioning when the light transmitting member 200 is installed.

Next, a fabricating apparatus for fabricating the wiring board 300 and a fabricating method using the fabricating apparatus will be explained successively in reference to FIG. 2 through FIG. 6. Further, in the following views, portions explained above are attached with the same notations, and an explanation thereof will be omitted.

Figure 2:
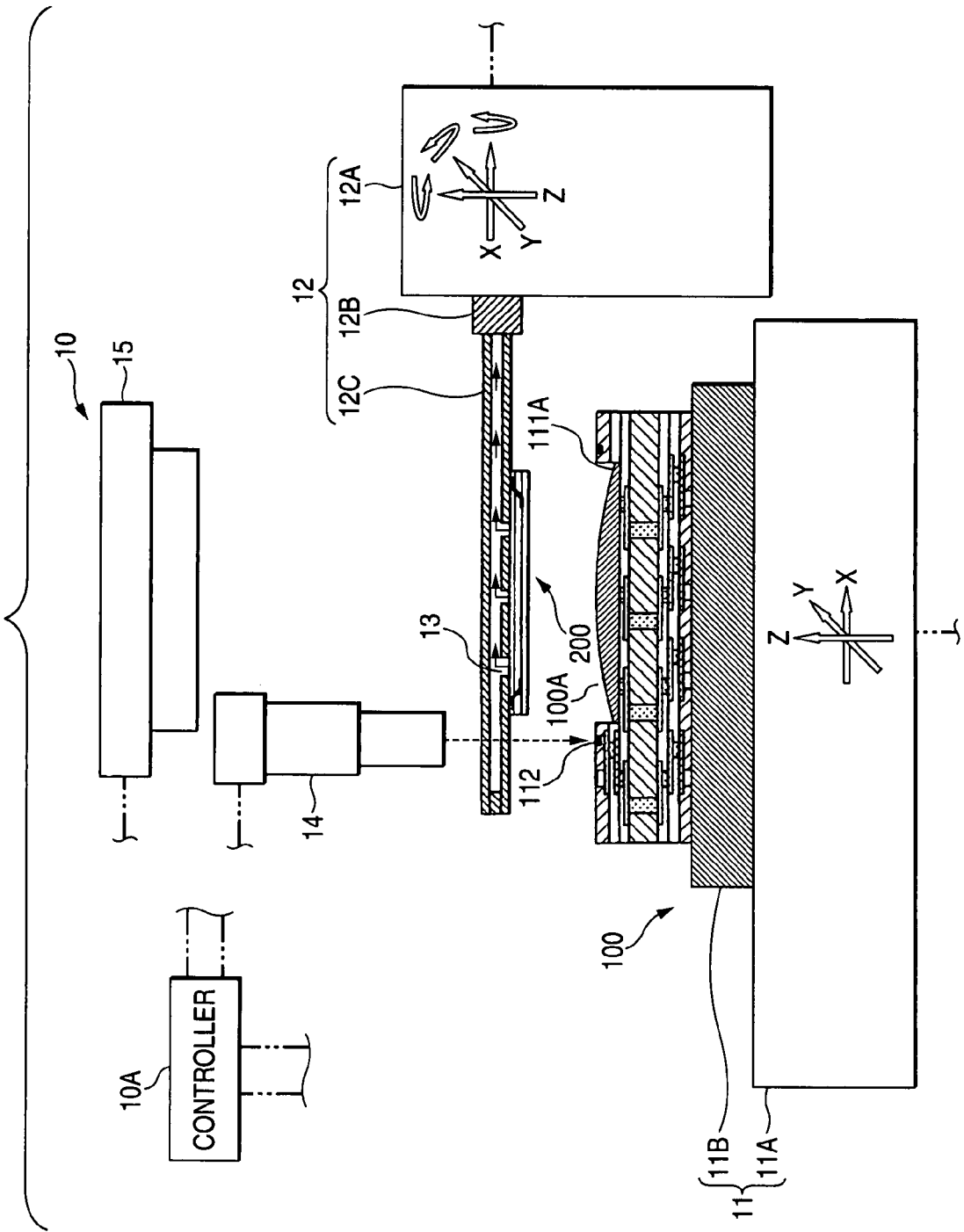
FIG. 2 is a view showing a method and an apparatus for fabricating a wiring board according to embodiment 1.

FIG. 2 is a view showing an outline of a fabricating apparatus 10 of the wiring board and one of steps of a fabricating method of the wiring board according to embodiment 1.

In reference to FIG. 2, the fabricating apparatus 10 according to the embodiment includes a holding portion 11 for holding the wiring board main body 100 and a holding portion 12 for holding the light transmitting member 200. The holding member 11 is constituted by a mounting base 11B mounted with the wiring board main body 100, and moving device 11A for moving the mounting base 11B along 3 axes (X axis, Y axis, Z axis) orthogonal to each other.

On the other hand, the holding portion 12 is constituted by light transmitting holder 12C for holding the light transmitting member 200 by, for example, vacuuming adsorption, a support portion 12B for supporting the holder 12C, and moving device 12A for moving the holder 12C along 3 axes (X axis, Y axis, Z axis) orthogonal to each other by way of the support portion 14B.

Further, the fabricating apparatus 10 includes recognizer, for example, (CCD camera or the like) 14 for recognizing an image of the marker 112 formed at the wiring board main body 100, and irradiator 15 for irradiating light (ultraviolet ray) for curing a photo-curing (for example, ultraviolet ray-curing) resin.

Further, the fabricating apparatus 10 includes controller 10A for controlling the holding portions 11, 12, the recognizer 14, and the irradiator 15. The controller 10A controls the holding portions 11, 12 in correspondence with an image signal recognized by the recognizer 14 and arranges the light transmitting member 200 held by the holder 12C to a pertinent position of the wiring board main body 100. Further, the controller 10A controls a timing of curing the photo-curing resin by controlling to irradiate light of the irradiator 15.

At the step shown in the drawing, first, the wiring board main body 100 in a state of not being mounted with the light transmitting member 200 is mounted on the mounting base 11B, and the light transmitting member 200 is held by the holder 12C. Further, the holder 12C is constituted by a light transmitting material of, for example, glass or the like and is constituted by a structure in which an adsorbing face for adsorbing the light transmitting member 200 is formed with an adsorbing hole 13.

Inside of the holder 12C is vacuumed to be exhausted by decompressor (not illustrated) of, for example, a pump or the like to be brought into a decompressed state. Therefore, at the adsorbing face formed with the adsorbing hole 13, the light transmitting member 200 can be vacuumed to adsorb.

Further, as a method of holding the light transmitting member 200 by the holder 12C, the method is not limited to vacuum adsorption but for example, electrostatic adsorption or adsorption using an adhering force may be used.

At the step shown in the drawing, further, the recess portion 100A is coated with a light (ultraviolet ray) curing resin 111A in a liquid state by a dispenser (not illustrated) or the like. Further, the wiring board main body previously coated with the light curing resin 111A may be mounted on the mounting base 11B.

Further, positioning of the light transmitting member 200 relative to the wiring board main body 100 is carried out by recognizing the image of the marker (reference point) 112 of the board main body 100 transmitting through the holder 12C by the recognizer 14. In this case, the holding portion 11 or the holding portion 12 is controlled by the controller 10A in correspondence with a signal of the image recognized by the recognizer 14, and a relative positional relationship between the light transmitting member 200 and the wiring board main body 100 is controlled.

In this case, in order to further improve the mounting accuracy of the light transmitting member 200, a position of the light transmitting member 200 may be recognized by the recognizer 14 In this case, the mirror 203 is used as a marker (reference point) for grasping the position of the light transmitting member 200.

Figure 3:
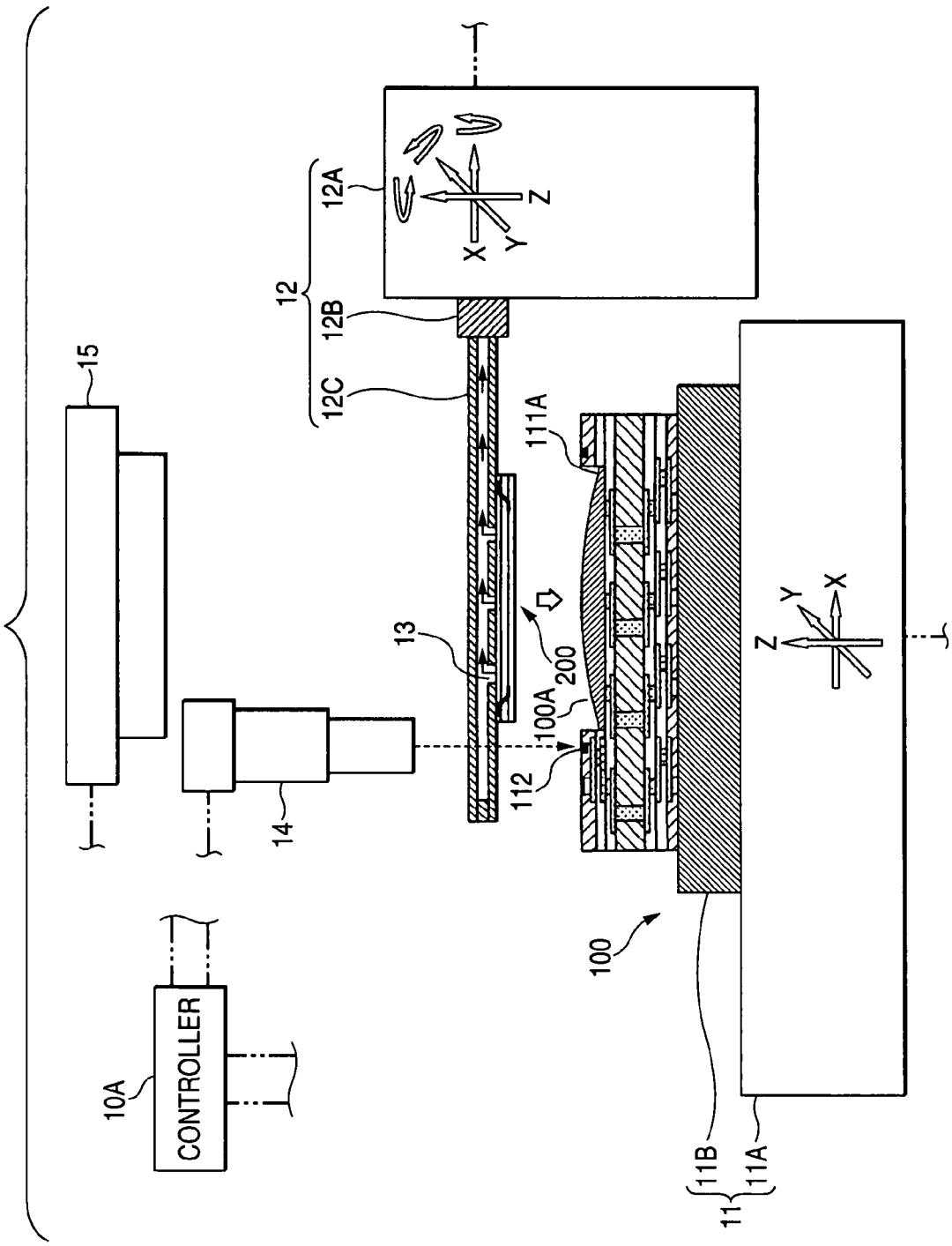
FIG. 3 is a view showing the method and the apparatus for fabricating a wiring board according to embodiment 1.

Next, a step shown in FIG. 3 will be explained. At the step shown in the drawing, by moving up the mounting base 11B, or moving down the support portion 14B while maintaining a positional relationship (positional relationship in a horizontal direction) of X, Y directions of the light transmitting member 200 and the wiring board main body 100 controlled by the step of FIG. 2, a distance of the light transmitting member 200 relative to the wiring board 100 is contracted.

Figure 4:
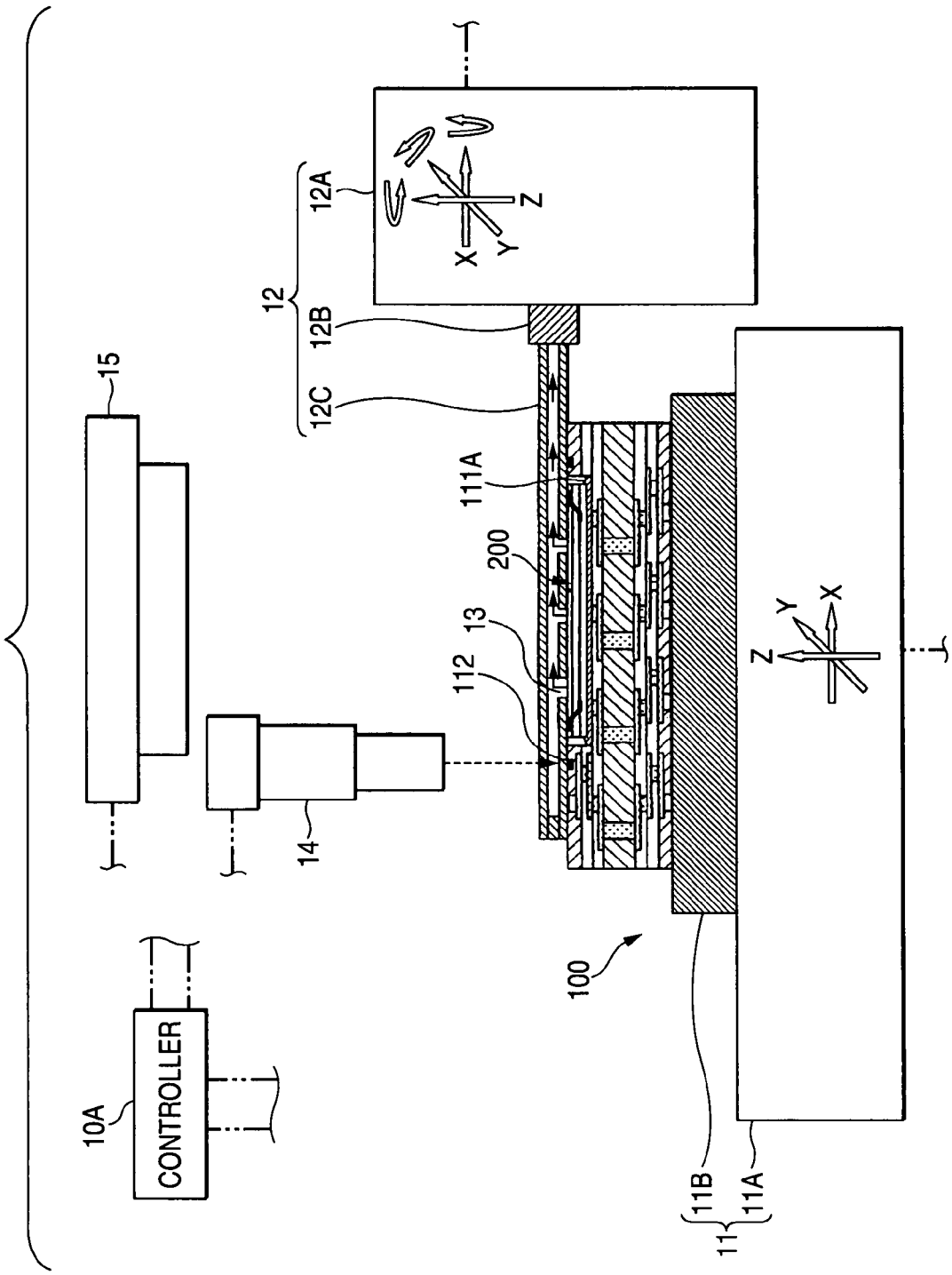
FIG. 4 is a view showing the method and the apparatus for fabricating a wiring board according to embodiment 1.

Further, at the step shown in FIG. 4, the mounting base 11B is continued to move up, or the support portion 12B is continued to move down, the light transmitting member 200 is mounted onto the recess portion 10A, and the movement is stopped when the light transmitting member 200 is disposed at a position of being substantially brought into contact with the light curing resin 111A coated on the recess portion 100A.

Figure 5:
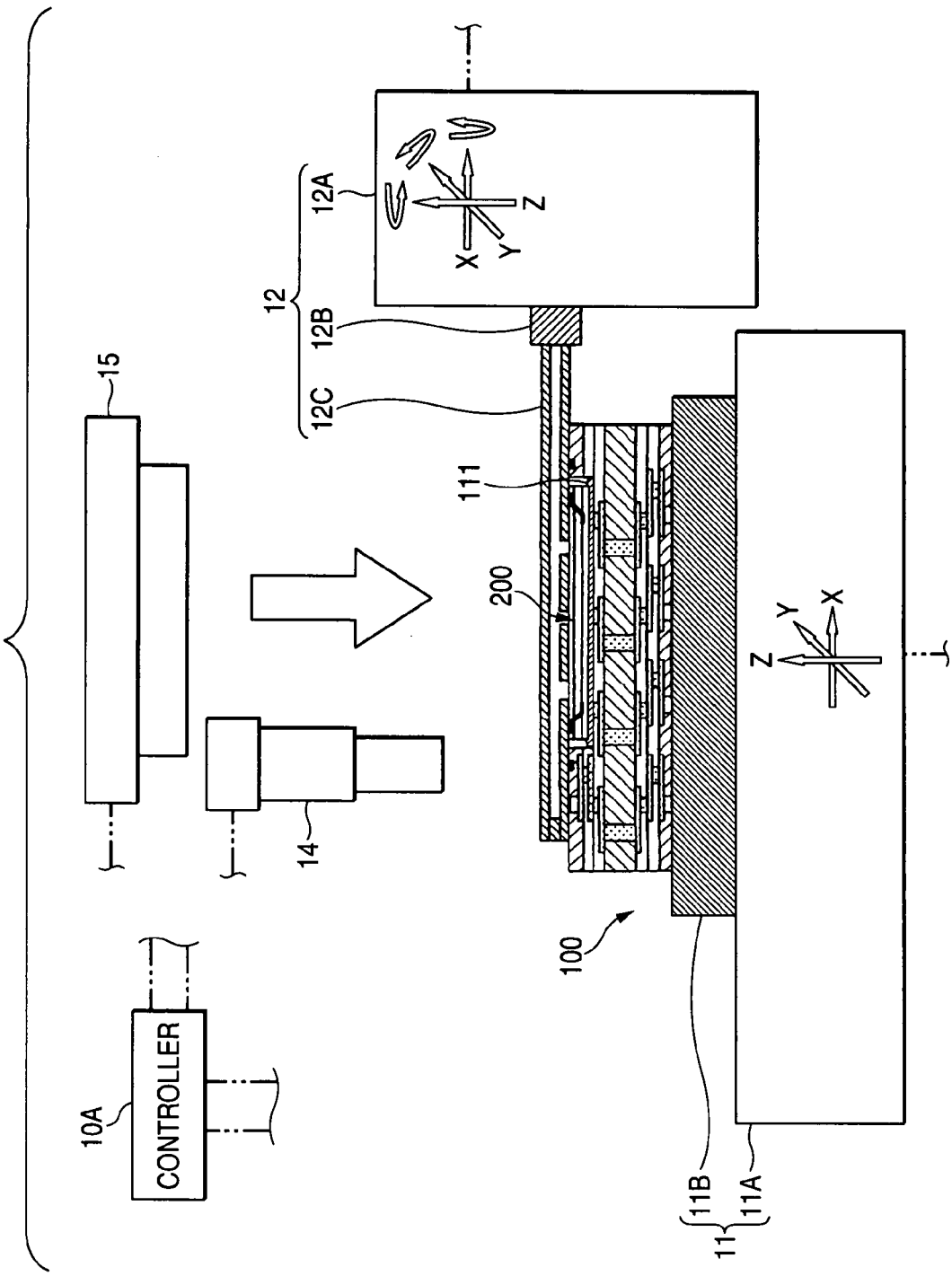
FIG. 5 is a view showing the method and the apparatus for fabricating a wiring board according to embodiment 1.

Next, at the step shown in FIG. 5, light (ultraviolet ray) is irradiated to the holder 12C by the irradiator 15. Here, irradiated light transmits through the holder 12C and the light transmitting member 200 and cures the light curing resin 111A permeated to between the light transmitting member 200 and the wiring board main body 100 to change into the resin material 111. At the step, the light transmitting member 200 is bonded to the wiring board main body 100 by the resin material 111.

Figure 6:
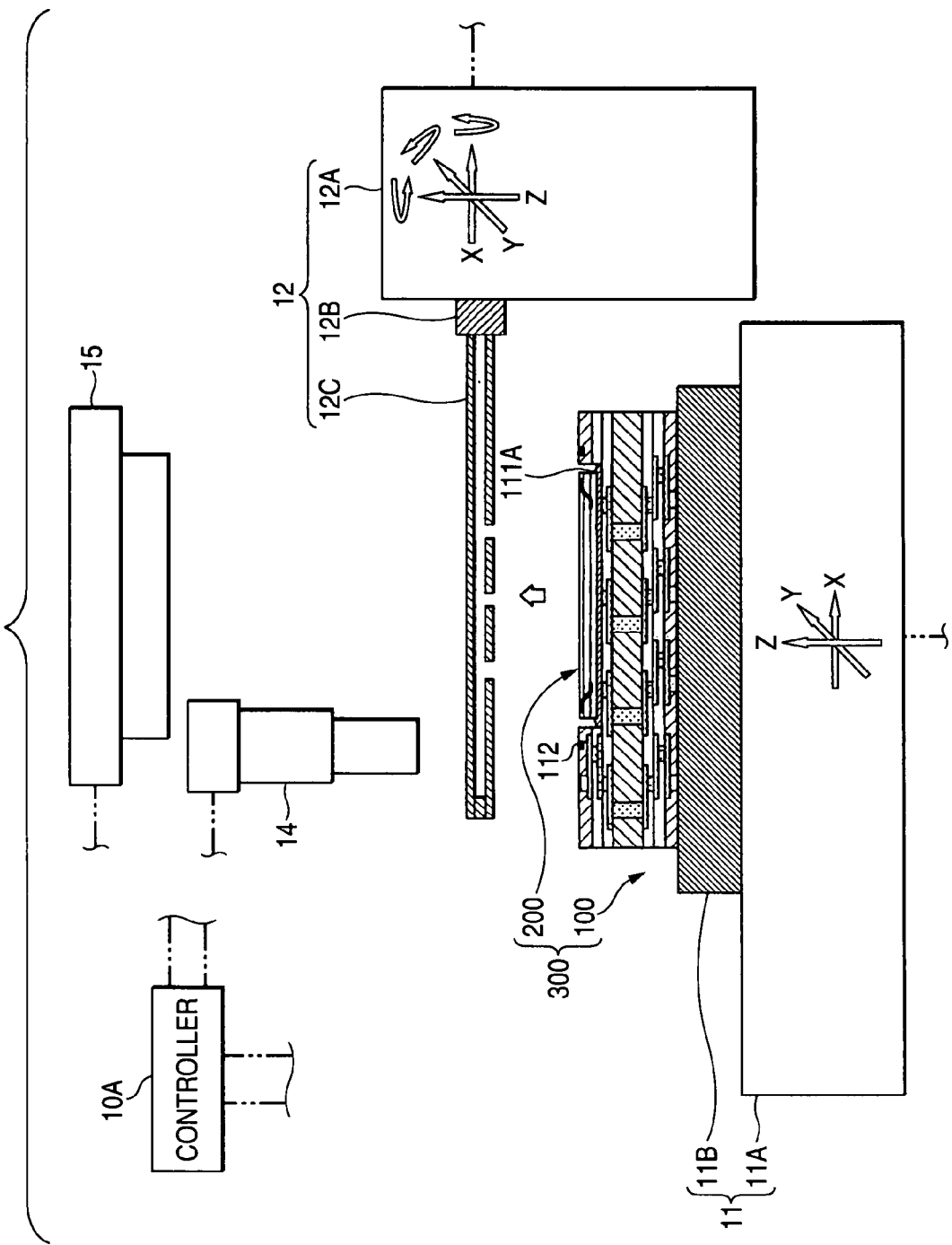
FIG. 6 is a view showing the method and the apparatus for fabricating a wiring board according to embodiment 1.

Next, at the step shown in FIG. 6, by stop operating the vacuum adsorbing mechanism of the holder 12C, and moving down the mounting base 11B or moving up the support portion 12B, the holder 12C is separated from the light transmitting member 200. The wiring board 300 shown in FIG. 1 is fabricated by the above-described steps.

The fabricating method (fabricating apparatus) according to the embodiment is provided with characteristics shown below. First, when the light transmitting member is mounted thereon, the method by curing by light (ultraviolet ray) is used, and therefore, the fabricating method (fabricating apparatus) is provided with a characteristic of improving the mounting accuracy in comparison with the method by thermosetting of the background art. For example, when the thermosetting resin is used, in a heating step of curing the resin, deformation by heat is brought about at the light transmitting member or the wiring board main body, and it is difficult to mount the light transmitting member with excellent accuracy.

For example, in a case of a light and electricity mixedly mounted board of recent years, it is necessary that an accuracy of a relative positional relationship of a light waveguide path and an optical function element (light receiving element or light emitting element or the like) is excellent. For example, as a positional accuracy of mounting a light waveguide path, about ±5 μm is requested, and in mounting by heating, it is difficult to realize such a mounting accuracy.

On the other hand, in the fabricating method (fabricating apparatus) according to the embodiment, there is adopted the method of bonding the light transmitting member to the wiring board main body by curing the light curing resin, and therefore, the light transmitting member can be mounted to the wiring board main body by an excellent accuracy. Such a mounting accuracy (for example, positional accuracy of mounting the light transmitting member is equal to or smaller than about ±5 μm) is difficult to realize when the thermosetting resin is used, and the fabricating method (fabricating apparatus) according to the embodiment can realize such a mounting accuracy.

Further, according to the embodiment, the light transmitting member 200 as well as the holder 12C are constituted by the material (for example, glass) for transmitting light (for example, ultraviolet ray). Therefore, the photo-curing resin can be cured by light in the state in which the light transmitting member 200 is held at the mounting position by the holder 12C. Therefore, the light transmitting member can be mounted to the mounting position of the wiring board main body with excellent mounting accuracy and easily.

Further, in a case of the embodiment, the holder 12C is light transmitting, and therefore, there is achieved an effect of facilitating to recognize the marker (reference point) 112 for positioning of the wiring board main body 100C even when the marker is covered by the holder 12C. Further, similarly, also the reference point of the light transmitting member 200 held by the holder 12C (mirror 203) is facilitated to be recognized.

Therefore, the relative positional relationship between the light transmitting member 200 and the wiring board main body 100 can be controlled by the controller 10A accurately and swiftly. As a result, the productivity of the wiring board is improved, and mounting accuracy of the light transmitting member to be mounted is further improved.

Further, although in the above-described embodiment, as an example of the light transmitting member, an explanation is given by taking an example of the light waveguide path, the invention is not limited thereto. For example, the invention is applicable also to a case of mounting a light transmitting optical part of a light transmitting optical lens similar to the light waveguide path.

Although the invention with regard to the preferable embodiment as described above is explained, the invention is not limited to the above-described specific embodiments, but can variously be modified or changed within the gist described in the scope of claims.

According to the invention, the method for fabricating the wiring board mounted with the light transmitting member with excellent accuracy, and the apparatus for fabricating the wiring board mounted with the light transmitting member with excellent accuracy can be provided.

What is claimed is:

1. A method for fabricating a wiring board comprising:
    a mounting step of mounting a light transmitting member, the mounting step including:
    an arranging step of holding the light transmitting member by light transmitting holder to arrange the light transmitting member at a wiring board main body; and
    a step of curing a photo-curing resin material between the light transmitting member and the wiring board main body by light that is irradiated to enter one outside surface of the holder and exit an opposite outside surface of the holder, and thus is transmitted through the light transmitting member and the holder.

2. The method for fabricating a wiring board according to claim 1, wherein
    at the arranging step, positioning of the light transmitting member relative to the wiring board main body is carried out by recognizing an image of a reference point of the board main body transmitted through the holder.

3. The method for fabricating a wiring board according to claim 1, wherein
    the light transmitting member is held by the holder by one of vacuum adsorption, electrostatic adsorption and adsorption using an adhering force.

4. The method for fabricating a wiring board according to claim 1, wherein
    the light transmitting member includes a light waveguide path.

5. An apparatus for fabricating a wiring board by mounting a light transmitting member thereon, comprising:
    a light transmitting holder for holding the light transmitting member to arrange the light transmitting member at a wiring board main body; and
    a light irradiator for curing a photo-curing resin material between the light transmitting member and the wiring board main body by irradiating light that enters one outside surface of the holder and exits an opposite outside surface of the holder, and thus is transmitted through the holder and the light transmitting member.

6. The apparatus for fabricating a wiring board according to claim 5, further comprising:
    a recognizer for recognizing an image of a reference point of the wiring board main body transmitted through the holder for positioning the light transmitting member relative to the wiring board main body.

7. The apparatus for fabricating of a wiring board according to claim 5, wherein
    the holder is constituted to hold the light transmitting member by one of vacuum adsorption, electrostatic adsorption and adsorption using an adhering force.

8. The fabricating apparatus of a wiring board according to claim 5, wherein
    the light transmitting member includes a light waveguide path.

9. The fabricating apparatus of a wiring board according to claim 5, further comprising:
    a mirror for reflecting signal light.

* * * * *